United States Patent
Shi

(10) Patent No.: US 10,006,939 B2
(45) Date of Patent: Jun. 26, 2018

(54) TESTING PROBE AND SEMICONDUCTOR TESTING FIXTURE, AND FABRICATION METHODS THEREOF

(71) Applicant: TONGFU MICROELECTRONICS CO., LTD., Nantong (CN)

(72) Inventor: Lei Shi, Nantong (CN)

(73) Assignee: TONGFU MICROELECTRONICS CO., LTD., Nantong (CN)

( * ) Notice: Subject to any disclaimer, the term of this patent is extended or adjusted under 35 U.S.C. 154(b) by 196 days.

(21) Appl. No.: 14/927,169

(22) Filed: Oct. 29, 2015

(65) Prior Publication Data

US 2016/0124016 A1    May 5, 2016

(30) Foreign Application Priority Data

Oct. 30, 2014  (CN) .......................... 2014 1 0603570
Oct. 30, 2014  (CN) .......................... 2014 1 0605989
Oct. 30, 2014  (CN) .......................... 2014 1 0606182

(51) Int. Cl.
   *G01R 1/067*  (2006.01)
   *G01R 3/00*   (2006.01)

(52) U.S. Cl.
   CPC ..... *G01R 1/06722* (2013.01); *G01R 1/06733* (2013.01); *G01R 3/00* (2013.01)

(58) Field of Classification Search
   None
   See application file for complete search history.

(56) References Cited

U.S. PATENT DOCUMENTS

| 4,138,643 | A  | * | 2/1979 | Beck ...................... G01R 1/067 324/72.5 |
| 5,534,787 | A  | * | 7/1996 | Levy .................. G01R 1/06772 324/754.09 |
| 7,950,927 | B2 | * | 5/2011 | Kazama ............... G01R 1/0466 324/755.05 |
| 2005/0212544 | A1 | * | 9/2005 | Nakajima ............ G01R 1/0408 324/750.25 |

FOREIGN PATENT DOCUMENTS

| CN | 101514997 A | 8/2009 |
| CN | 101713790 A | 5/2010 |
| CN | 201654080 U | 11/2010 |
| JP | 5470142 B2  | 4/2014 |

* cited by examiner

*Primary Examiner* — Paresh Patel
(74) *Attorney, Agent, or Firm* — Anova Law Group, PLLC

(57) ABSTRACT

Testing probe and semiconductor testing fixture, and their fabrication methods are provided. A testing probe may configure a chamber through an insulating body. A first testing pin is disposed inside the chamber of the insulating body. The first testing pin includes: a first testing terminal on one end of the first testing pin and a first connection terminal on another end of the first testing pin. An elastic member is disposed inside the chamber and attached to the first testing pin to drive an upward or downward movement of the first testing pin along the chamber. A second testing pin is disposed around an outer sidewall surface of the insulating body enclosing the first testing pin. The second testing pin includes a second testing terminal on one end of the second testing pin and a second connection terminal on another end of the second testing pin.

18 Claims, 7 Drawing Sheets

TESTING PROBE AND SEMICONDUCTOR TESTING FIXTURE, AND FABRICATION METHODS THEREOF

CROSS-REFERENCES TO RELATED APPLICATIONS

This application claims the priority of Chinese Patent Application No. CN201410603570.x, filed on Oct. 30, 2014, Chinese Patent Application No. CN201410605989.9, filed on Oct. 30, 2014, and Chinese Patent Application No. CN201410606182.7, filed on Oct. 30, 2014, the entire contents of all of which are incorporated herein by reference.

FIELD OF THE DISCLOSURE

The present disclosure generally relates to the field of semiconductor testing technologies and, more particularly, relates to a testing probe and a semiconductor testing fixture, and their fabrication methods.

BACKGROUND

In semiconductor IC manufacturing processes, packaged IC chips may be retested to ensure the electrical characteristics and the functionality. Based on the test results of the electrical characteristics, the IC chips may be classified into different product categories. In addition, the IC chips are subject to visual and mechanical inspection.

The testing of electrical characteristics is intended for measuring various electrical parameters to verify the desired operation of the IC chips.

A conventional two-point contact testing on a same test terminal, for example, Kelvin test, may often include double thimble or double gold finger arranged in parallel. However, there are certain drawbacks as follows.

Low manufacturing precision. The constantly shrinking dimensions of the semiconductor IC chips may cause the shrinking dimensions of the test terminals and the shrinking distances between different test terminals. The precision requirements of the conventional testing such as double thimble or double gold finger arranged in parallel may become too stringent to meet as the dimensions of the test terminals and the distances between different test terminals continue to shrink.

Weak structural strength. In order to achieve the two-point contact on a limited surface of the test terminal, the double thimble or the double gold finger may be made thinner and thinner and accordingly the mechanical structural strength may be weaker and weaker.

Short life span. Testing pins used in the thimble or gold finger testing are often subject to wear and tear. Such wear and tear may be elevated when the high precision requirement weakens the mechanical structural strength. Excessive wear and tear may shorten the life span of testing fixtures.

Low measurement resolution. To accommodate the demand for light weight and small dimension semiconductor IC chips, the constantly shrinking thimble and gold finger dimension may often cause the resistance to increase. When large current measurements are performed, substantial voltage drop may occur and affect the measurement accuracy. On the other hand, the double thimble and double gold finger arranged in parallel may be vulnerable to the displacement deviation between the two testing pins which often produces measurement errors.

Moreover, in order to reduce the distance between the two testing pins, the double thimble arranged in parallel may be configured in a back-to slope contact manner. In such configuration, the testing pins may rotate out of the contact area of the test terminal due to torsion of the spring in the testing fixture. Thus, the measurement accuracy may be affected. Further, the existing testing pins are often unable to perform electrical characteristics testing when the test terminals are in the hemisphere shape.

The disclosed testing probe and semiconductor testing fixture, and their fabrication methods are directed to solve one or more problems set forth above and other problems in the art.

BRIEF SUMMARY OF THE DISCLOSURE

One aspect of the present disclosure includes a testing probe for a semiconductor testing fixture. The testing probe may configure a chamber through an insulating body. A first testing pin is disposed inside the chamber of the insulating body. The first testing pin includes: a first testing terminal on one end of the first testing pin and a first connection terminal on another end of the first testing pin. An elastic member is disposed inside the chamber and attached to the first testing pin to drive an upward or downward movement of the first testing pin along the chamber. A second testing pin is disposed around an outer sidewall surface of the insulating body enclosing the first testing pin. The second testing pin includes a second testing terminal on one end of the second testing pin and a second connection terminal on another end of the second testing pin.

Another aspect of the present disclosure provides a semiconductor testing fixture. The semiconductor testing fixture includes a substrate, a plurality of the testing probes configured on the substrate. Each testing probe includes: an insulating body having a chamber configured through the insulating body; a first testing pin disposed inside the chamber of the insulating body, and including: a first testing terminal on one end of the first testing pin and a first connection terminal on another end of the first testing pin; an elastic member disposed inside the chamber and attached to the first testing pin to drive an upward or downward movement of the first testing pin along the chamber; and a second testing pin disposed around an outer sidewall surface of the insulating body enclosing the first testing pin, and including: a second testing terminal on one end of the second testing pin and a second connection terminal on another end of the second testing pin. An inspection unit is electrically connected to either the first connection terminal of the first testing pin or the second connection terminal of the second testing pin and configured to determine whether the testing probe has a contact with the first connection terminal or the second connection terminal during an electrical characteristics testing.

Another aspect of the present disclosure provides a method for forming a testing probe for a semiconductor testing fixture by providing an insulating body having a chamber through the insulating body. A first testing pin is configured inside the chamber of the insulating body, the first testing pin including: a first testing terminal on one end of the first testing pin and a first connection terminal on another end of the first testing pin. An elastic member is configured inside the chamber and attached to the first testing pin to drive an upward or downward movement of the first testing pin along the chamber. A second testing pin is configured around an outer sidewall surface of the insulating body enclosing the first testing pin, the second testing pin including: a second testing terminal on one end of the second testing pin and a second connection terminal on another end of the second testing pin.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
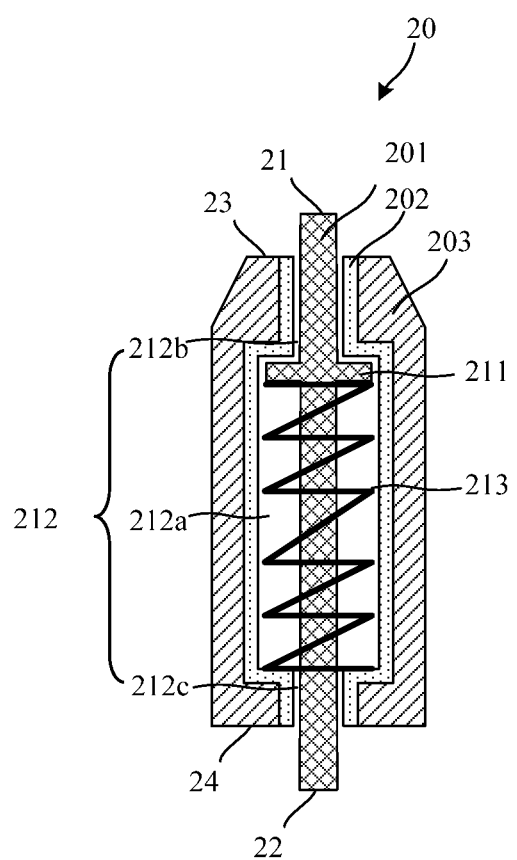
FIG. 1 illustrates a schematic view of an exemplary testing probe according to various disclosed embodiments of the present disclosure.

The present disclosure provides a coaxial testing probe. The testing probe may include an insulating body in a barrel shape. A chamber may run through the insulating body between opposite ends, e.g., including a top end and a bottom end of the insulating body. A first testing pin may be disposed inside the chamber of the insulating body. The first testing pin may include a first body, a first testing terminal on one end of the first body, and a first connection terminal on the other end of the first body. An elastic member may be disposed inside the chamber.

The elastic member may be attached to the first testing terminal to drive the movement of the first testing terminal upward and downward along the chamber. A second testing pin may be disposed around the outer sidewall of the insulating body enclosing the first testing pin. The second testing pin may be coaxial with the first testing pin. The second testing pin may include a second body, a second testing terminal on one end of the second body, and a second connection terminal on the other end of the second body.

The present disclosure provides a first testing pin and a second testing pin integrated into one testing probe. The second testing pin may surround the first testing pin. The second testing pin and the first testing pin may be electrically isolated by an insulating body. The testing probe may have enhanced mechanical structural strength when the testing probe dimension is relatively small.

Further, the first testing pin and the second testing pin may be coaxially configured. The distance between the first testing pin and the second testing pin may be precisely controlled to improve the measurement resolution. Further, one testing probe may be sufficient to perform the electrical characteristics testing as compared with two or more testing probes (e.g., double thimble or double gold finger) currently required for the same testing. Further, the first testing pin may move upward and downward along the chamber. During the testing, the wear and tear of the first testing pin may be compensated by the movement of the first testing pin driven by the elastic member to ensure that the tip of the first testing pin is consistently coplanar with the tip of the second testing pin. Thus, the wear and tear of the first testing pin and the second testing pin may not disrupt or compromise the electrical characteristics testing. Further, the first testing pin may protrude outward when not engaging with test terminals. When the testing is performed, the first testing pin may contact the test terminal first so that the desirable alignment between the testing probe and the test terminal may be verified.

Reference will now be made in detail to exemplary embodiments of the disclosure, which are illustrated in the accompanying drawings. Wherever possible, the same reference numbers will be used throughout the drawings to refer to the same or like parts. It should be understood that the exemplary embodiments described herein are only intended to illustrate and explain the present invention and not to limit the present invention.

FIG. 1 illustrates a schematic view of an exemplary testing probe according to the present disclosure. Referring to FIG. 1, the present disclosure provides a testing probe 20. The testing probe 20 may include an insulating body 202, a first testing pin 201, an elastic member 213, and a second testing pin 203.

The insulating body 202 may include a chamber 212 which runs through the insulating body 202 between two ends thereof. The first testing pin 201 may be disposed inside the chamber 212 of the first insulating body 202. The first testing pin 201 may include a first body, a first testing terminal 21 on one end of the first body, and a first connection terminal 22 on the other end of the first body. The elastic member 213 may be disposed inside the chamber 212. The elastic member 213 may be attached to the first testing pin 201 to drive the movement of the first testing pin 201 upward and downward along the chamber 212.

The second testing pin 203 may be disposed around the outer sidewall of the insulating body 202 enclosing the first testing pin 201. The second testing pin 203 may be coaxial with the first testing pin 201. The second testing pin 203 may include a second body, a second testing terminal 23 on one end of the second body, and a second connection terminal 24 on the other end of the second body.

The chamber 212 of the insulating body 202 may include a first chamber section 212a, a second chamber section 212b connecting to the upper end of the first chamber section 212a, and a third chamber section 212c connecting to the lower end of the first chamber section 212a. The first chamber section 212a may run through the second chamber section 212b. The third chamber section 212c may run through the first chamber section 212a. The second chamber section 212b and the third chamber section 212c may have a diameter smaller than the diameter of the first camber section 212a. The first testing pin 201 may run through the first chamber section 212a, the second chamber section 212b, and the third chamber section 212c. The elastic member 213 may be disposed inside the first chamber section 212a.

The first testing pin 201 may have a cylindrical shape with a circular cross-section. The insulating body 202 may have a ring cross-section. The second testing pin 203 may also have a ring cross-section. The first testing pin 201 may have other cross-sectional shapes. For example, the first testing pin 201 may have a regular polygon cross-sectional shape, such as an equilateral triangle or a square.

The first testing pin 201 may have a small diameter approximately of 100 nm to 500000 nm. In one embodiment, the first testing pin 201 may have a diameter approximately of 200 nm to 50000 nm. The insulating body 202 may have a small width (or sidewall thickness) approximately of 80 nm to 400000 nm. In one embodiment, the insulating body 202 may have a width approximately of 100 nm to 10000 nm. Accordingly, the second testing pin 203 may have a small width approximately of 60 nm to 300000 nm. In one embodiment, the second testing pin 203 may have a diameter approximately of 90 nm to 25000 nm.

In other embodiments, the first testing pin 201 may have different diameters. Accordingly, the insulating boy 202 and the second testing pin 203 may have different widths.

The insulating body 202 may be made of resin material, such as, epoxy resin, polyimide resin, polyethylene resin, benzocyclobutene resin, or polybenzoxazole resin, etc. The insulating body 202 may also be made of insulating dielectric material, such as, one or more of silicon oxide, silicon nitride, silicon oxynitride, and nitride bonded silicon carbide.

The insulating body 202 may have a single layer structure or a multi-layer stacked structure.

The first testing pin 201 may have a stopper protrusion 211 configured on the first body. The stopper protrusion 211 may be disposed inside the first chamber section 212a. The elastic member 213 may have one end pressing against the stopper protrusion 211 and the other end pressing against the bottom surface of the first chamber section 212a.

When the testing probe 20 is not in a testing state (the elastic member 213 is in an extended state), the stopper protrusion 211 may restrain the first testing pin to maintain a fixed position relatively to the position of the second testing pin 203. In certain embodiment, a plurality of testing probes 20 may be configured in an exemplary testing fixture. When not in a testing state, the first testing pins 201 of the plurality of the testing probes 20 may be confined to a same position where the first testing terminals 21 of the first testing pins 201 maintain the uniform height. When the packaged structure under testing is placed on the semiconductor testing fixture, the uneven height of the first testing terminals 21 of the plurality of the first testing pins 201 should be prevented to avoid affecting the testing procedure and testing structure.

In one embodiment, the elastic member 213 may be a spring. The first testing pin 213 may pass through the center of the spring. The spring may have one end pressing against the stopper protrusion 211 and another end pressing against the bottom surface of the first chamber section 212a. When not in the testing state, the elastic member 213 (i.e., the spring) may push the stopper protrusion 211 upward to press against the top surface of the first chamber section 212a. The first testing terminal 21 of the first testing pin 201 may protrude above the second the testing terminal 23 of the second testing pin 203. When in the testing state, the packaged structure under testing may be placed on the testing probe. The first testing pin 21 may move downward due to the external pressure. The elastic member 213 (i.e., the spring) may be compressed. The first testing pin 201 may stop moving downward until the surface of the first testing terminal 21 of the first testing pin 201 is coplanar with the surface of the second testing terminal 23 of the second testing pin 203. At the point, both the surface of the first testing terminal 21 of the first testing pin 201 and the surface of the second testing terminal 23 of the second testing pin 203 may contact the surface of the testing terminal of the packaged structure under testing.

The first testing pin 201 may have a dimension smaller than the dimensions of the second chamber section 212b and the third chamber section 212c to allow the upward and downward movement of the first testing pin 201 along the chamber 212.

The second testing pin 203 may be disposed around the outer sidewall surface of the insulating body 202. The second testing pin 203 may be fastened to the insulating body 202. The surface of the second testing terminal 23 of the second testing pin 203 may be coplanar with the top surface of the insulating body 202. In one embodiment, the first chamber section 212a, the second chamber section 212b, and the third chamber section 212c may have a uniform sidewall thickness. The second chamber section 212b and the third chamber section 212c may have a diameter smaller than the diameter of the first chamber section 212a so that the middle section of the insulating body 202 (corresponding to the first chamber section 212a) protrudes outward. The second testing pin 203 may have a recessed inner sidewall matching the contour of the protruded middle section of the insulating body 202. When the second testing pin 203 is fastened to the outer sidewall surface of the insulating body 202, both the contact area and the adhesive force may be increased causing the second testing pin 203 unlikely to detach from the outer sidewall of the insulating body 202. Thus, the life span of the testing probe 20 may be extended.

The first testing pin 201 and the second testing pin 203 may be made of copper, gold, tungsten, alloy, other suitable metal, or other metallic compound material. The first testing pin 201 and the second testing pin 203 may be made of same material or different materials.

In one embodiment, the second testing pin 203 may have a body shape with gradually reduced diameter toward the second testing terminal 23. The closer to the second testing terminal 23, the smaller the diameter. When a plurality of testing probes 20 is used in testing, the distance between the testing terminals of adjacent testing probes 20 may increase.

The present disclosure provides a first testing pin 201 and a second testing pin 203 integrated into one testing probe 20. The second testing pin 203 may surround the first testing pin 201. The second testing pin 203 and the first testing pin 201 may be electrically isolated by an insulating body 202. The testing probe 20 may have enhanced mechanical structural strength when the testing probe 20 dimension is relatively small.

Further, the first testing pin 201 and the second testing pin 203 may be coaxially configured. The distance between the first testing pin 201 and the second testing pin 203 may be precisely controlled without fluctuation during the testing to improve the measurement resolution. Further, the first testing pin 201 and the second testing pin 203 are integrated into one testing probe 20 according to the present disclosure. One testing probe 20 may be sufficient to perform the electrical characteristics testing as compared with two or more testing probes (e.g., double thimble or double gold finger) currently required for the same testing. Further, the first testing pin 201 may move upward and downward along the chamber 212. During the testing, the wear and tear of the first testing terminal 21 of the first testing pin 201 may be compensated by the movement of the first testing pin 201 driven by the elastic member 213 to ensure that the surface of the first testing terminal 21 of the first testing pin 201 is consistently coplanar with the surface of the second testing terminal 23 of the second testing pin 203. Thus, the wear and tear of the first testing pin 201 and the second testing pin 203 may not disrupt or compromise the electrical characteristics testing. Further, the first testing terminal 21 of the first testing pin 201 may protrude outward when not engaging with test terminals. When the testing is performed, the first testing pin 201 may contact the test terminal first so that the desirable alignment between the testing probe 20 and the test terminal may be verified.

The testing probe 20 according to the present disclosure may be used in electrical characteristics testing. In one embodiment, the testing probe 20 may be used in resistance measurement or large current measurement. The testing probe 20 may contact the testing terminals such that the first testing terminal 21 of the first testing pin 201 and the second testing terminal 23 of the second testing pin 203 contact the surface of the testing terminals. A test voltage may be applied between the first testing pin 201 and the second testing pin 203. The current between the first testing pin 201 and the second testing pin 203 through the test terminals may be measured. The test voltage may be divided by the measured current to obtain the measured resistance.

When the testing probe 20 according to the present disclosure is used in measuring the resistance, the test current may evenly flow from the first testing pin 201 in all directions toward the second testing pin 203. The annular area of the testing terminals (contacting the insulating body 202) between the first testing pin 201 and the second testing pin 203 may allow the averaging of the currents uniformly flowed in different directions to improve the measurement accuracy.

In other embodiments, the testing probe according to the present disclosure may be used in other electrical characteristics testing. For example, a plurality of testing probes may be used in an electrical characteristics testing to measure a current flowing between the first or the second testing pin of one testing probe and the first or the second testing pin of another testing probe, or a current flowing between the first and the second testing pin of one testing probe and the first and the second testing pin of another testing probe.

Figure 2:
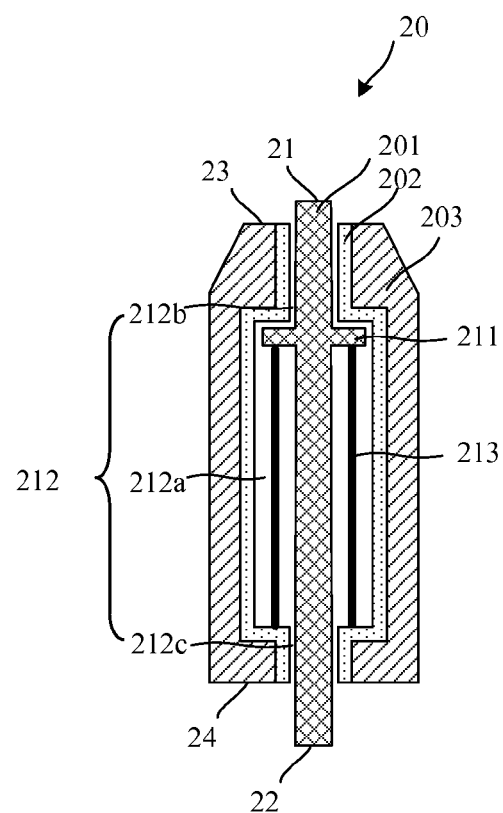
FIG. 2 illustrates a schematic view of another exemplary testing probe according to various disclosed embodiments of the present disclosure.

FIG. 2 illustrates a schematic view of another exemplary testing probe according to the present disclosure. Referring to FIG. 2, the present disclosure provides another testing probe 20. The testing probe 20 may include an insulating body 202, a first testing pin 201, an elastic member 213, and a second testing pin 203.

The insulating body 202 may include a chamber 212 which runs through the insulating body 202 between both ends. The first testing pin 201 may be disposed inside the chamber 212 of the first insulating body 202. The first testing pin 201 may include a first body, a first testing terminal 21 on one end of the first body, and a first connection terminal 22 on the other end of the first body. The elastic member 213 may be disposed inside the chamber 212. The elastic member 213 may be attached to the first testing pin 201 to drive the movement of the first testing pin 201 upward and downward along the chamber 212. The second testing pin 203 may be disposed around the outer sidewall of the insulating body 202 enclosing the first testing pin 201. The second testing pin 203 may be coaxial with the first testing pin 201. The second testing pin 203 may include a second body, a second testing terminal 23 on one end of the second body, and a second connection terminal 24 on the other end of the second body.

In other embodiments, the elastic member 213 is different. The elastic member 213 may be a metal spring plate. The metal spring plate may have one end pressing against the stopper protrusion 211 and the other end pressing against the bottom surface of the first chamber section 212a.

The metal spring plate may be made of copper, tungsten, and/or metal alloy.

When not in the testing state, the metal spring plate 213 may be in a straight state. At the same time, the stopper protrusion 211 may contact the top surface of the first chamber section 212a. When in the testing state, the first testing pin 201 may be pushed downward by an external force and the elastic member 213 (metal spring plate) may be in a bent state.

In one embodiment, when the elastic member 213 (metal spring plate) is in the straight state, the elastic member 213 (metal spring plate) may maintain a first distance from the side surface to the first testing pin 201 and the inner sidewall surface of the first chamber section 212a. At the same time, the first testing terminal 21 of the first testing pin 201 may protrude outward at a second distance above the second testing terminal 23 of the second testing pin 203. When testing the electrical characteristics, the first testing pin 201 may be pushed downward by the external force. In order to allow the surface of the first testing terminal 21 of the first testing pin 201 coplanar with the surface of the second testing terminal 23 of the second testing pin 203, the first distance must be greater than the second distance.

The metal spring plate may include a single metal strip, or two or more metal strips. The plurality of metal strips may be disposed symmetrically or spaced in equal angles around the first testing pin 201 to keep the force exerted by the metal spring plate uniformly around the first testing pin 201. Thus, the first testing pin 201 may move upward or downward smoothly.

In one embodiment, the stopper protrusion 211 may have a plurality of recesses or through-holes on the bottom surface. Similarly the first chamber section 212a may have a plurality of recesses or through-holes on the bottom surface. One end of the metal spring plate may be attached to the plurality of recesses or through-holes on the bottom surface of the stopper protrusion 211. The other end of the metal spring plate may be attached to the plurality of recesses or through-holes on the bottom surface of the first chamber section 212a. Thus, undesirable displacement of the metal spring plate may be avoided.

Figure 5:
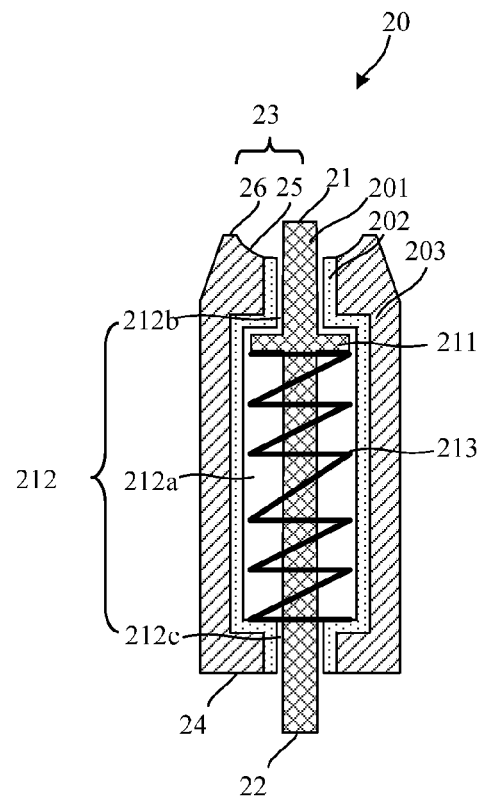
FIG. 5 illustrates a schematic view of another exemplary testing probe according to various disclosed embodiments of the present disclosure.

FIG. 5 illustrates a schematic view of another exemplary testing probe according to the present disclosure. Referring to FIG. 5, the present disclosure provides another testing probe 20. The testing probe 20 may include an insulating body 202, a first testing pin 201, an elastic member 213, and a second testing pin 203.

The insulating body 202 may include a chamber 212 which runs through the insulating body 202 between both ends. The first testing pin 201 may be disposed inside the chamber 212 of the first insulating body 202. The first testing pin 201 may include a first body, a first testing terminal 21 on one end of the first body, and a first connection terminal 22 on the other end of the first body. The elastic member 213 may be disposed inside the chamber 212. The elastic member 213 may be attached to the first testing pin 201 to drive the movement of the first testing pin 201 upward and downward along the chamber 212. The second testing pin 203 may be disposed around the outer sidewall of the insulating body 202 enclosing the first testing pin 201. The second testing pin 203 may be coaxial with the first testing pin 201. The second testing pin 203 may include a second body, a second testing terminal 23 on one end of the second body, and a second connection terminal 24 on the other end of the second body. The second testing terminal 23 may have a first curve surface 25.

The chamber 212 of the insulating body 202 may include a first chamber section 212a, a second chamber section 212b connecting to the upper end of the first chamber section 212a, and a third chamber section 212c connecting to the lower end of the first chamber section 212a. The first chamber section 212a may run through the second chamber section 212b. The third chamber section 212c may run through the first chamber section 212a. The second chamber section 212b and the third chamber section 212c may have a diameter smaller than the diameter of the first camber section 212a. The first testing pin 201 may run through the first chamber section 212a, the second chamber section 212b, and the third chamber section 212c. The elastic member 213 may be disposed inside the first chamber section 212a.

The insulating body 202 may have a small sidewall thickness approximately of 80 nm to 400000 nm. In one embodiment, the insulating body 202 may have a sidewall thickness approximately of 100 nm to 10000 nm.

The insulating body 202 may be made of resin material, such as, epoxy resin, polyimide resin, polyethylene resin, benzocyclobutene resin, or polybenzoxazole resin, etc. The insulating body 202 may also be made of insulating dielectric material, such as, one or more of silicon oxide, silicon nitride, silicon oxynitride, and nitride bonded silicon carbide. The insulating body 202 may have a single layer structure or a multi-layer stacked structure.

The first testing pin 201 may have a stopper protrusion 211 configured on the first body. The stopper protrusion 211 may be disposed inside the first chamber section 212a. The elastic member 213 may have one end pressing against the stopper protrusion 211 and the other end pressing against the bottom surface of the first chamber section 212a.

When the testing probe 20 is not in a testing state (the elastic member 213 is in an extended state), the stopper protrusion 211 may restrain the first testing pin to maintain a fixed position relatively to the position of the second testing pin 203. In certain embodiment, a plurality of testing probes 20 may be configured in an exemplary testing fixture. When not in a testing state, the first testing pins 201 of the plurality of the testing probes 20 may be confined to a same position where the first testing terminals 21 of the first testing pins 201 maintain the uniform height. When the packaged structure under testing is placed on the semiconductor testing fixture, the uneven height of the first testing terminals 21 of the plurality of the first testing pins 201 should be prevented to avoid affecting the testing procedure and testing structure.

In one embodiment, the elastic member 213 may be a spring. The first testing pin 213 may pass through the center of the spring. The spring may have one end pressing against the stopper protrusion 211 and another end pressing against the bottom surface of the first chamber section 212a.

When not in the testing state, the elastic member 213 (i.e., the spring) may push the stopper protrusion 211 upward to press against the top surface of the first chamber section 212a. The first testing terminal 21 of the first testing pin 201 may protrude above the second the testing terminal 23 of the second testing pin 203.

When in the testing state, the packaged structure under testing may be placed on the testing probe. The first testing pin 21 may move downward due to the external pressure. The elastic member 213 (i.e., the spring) may be compressed. The first testing pin 201 may stop moving downward until the surface of the first testing terminal 21 of the first testing pin 201 is coplanar with the surface of the second testing terminal 23 of the second testing pin 203.

At this point, both the surface of the first testing terminal 21 of the first testing pin 201 and the surface of the second testing terminal 23 of the second testing pin 203 may contact the surface of the testing terminal of the packaged structure under testing.

The first testing pin 201 may have a dimension smaller than the dimensions of the second chamber section 212b and the third chamber section 212c to allow the upward and downward movement of the first testing pin 201 along the chamber 212.

In another embodiment, the elastic member 213 is different. The elastic member 213 may be a metal spring plate. The metal spring plate may have one end pressing against the stopper protrusion 211 and the other end pressing against the bottom surface of the first chamber section 212a.

The metal spring plate may be made of copper, tungsten, or metal alloy.

When not in the testing state, the metal spring plate 213 may be in a straight state. At the same time, the stopper protrusion 211 may contact the top surface of the first chamber section 212a. When in the testing state, the first testing pin 201 may be pushed downward by an external force and the elastic member 213 (metal spring plate) may be in a bent state.

In one embodiment, when the elastic member 213 (metal spring plate) is in the straight state, the elastic member 213 (metal spring plate) may maintain a first distance from the side surface to the first testing pin 201 and the inner sidewall surface of the first chamber section 212a. At the same time, the first testing terminal 21 of the first testing pin 201 may protrude outward at a second distance above the second testing terminal 23 of the second testing pin 203. When the electrical characteristics testing is performed, the first testing pin 201 may be pushed downward by the external force. In order to allow the surface of the first testing terminal 21 of the first testing pin 201 coplanar with the surface of the second testing terminal 23 of the second testing pin 203, the first distance must be greater than the second distance.

The metal spring plate may include a single metal strip, or two or more metal strips. The plurality of metal strips may be disposed symmetrically or spaced in equal angles around the first testing pin 201 to keep the force exerted by the metal spring plate uniformly around the first testing pin 201. Thus, the first testing pin 201 may move upward or downward smoothly.

In one embodiment, the stopper protrusion 211 may have a plurality of recesses or through-holes on the bottom surface. Similarly the first chamber section 212a may have a plurality of recesses or through-holes on the bottom surface. One end of the metal spring plate may be attached to the plurality of recesses or through-holes on the bottom surface of the stopper protrusion 211. The other end of the metal spring plate may be attached to the plurality of recesses or through-holes on the bottom surface of the first chamber section 212a. Thus, undesirable displacement of the metal spring plate may be avoided.

The second testing pin 203 may be disposed around the outer sidewall surface of the insulating body 202. The second testing pin 203 may be fastened to the insulating body 202. The surface of the second testing terminal 23 of the second testing pin 203 may be coplanar with the top surface of the insulating body 202. In one embodiment, the first chamber section 212a, the second chamber section 212b, and the third chamber section 212c may have a uniform sidewall thickness. The second chamber section 212b and the third chamber section 212c may have a diameter smaller than the diameter of the first chamber section 212a so that the middle section of the insulating body 202 (corresponding to the first chamber section 212a) protrudes outward. The second testing pin 203 may have a recessed inner sidewall matching the contour of the protruded middle section of the insulating body 202. When the second testing pin 203 is fastened to the outer sidewall surface of the insulating body 202, both the contact area and the adhesive force may be increased causing the second testing pin 203 unlikely to detach from the outer sidewall of the insulating body 202. Thus, the life span of the testing probe 20 may be extended.

The first testing pin 201 and the second testing pin 203 may be made of copper, gold, tungsten, alloy, other suitable metal, or other metallic compound material. The first testing pin 201 and the second testing pin 203 may be made of same material or different materials.

In one embodiment, the insulating body 202 may have a top surface below the second testing terminal 23 of the second testing pin 203. The first testing terminal 21 of the first testing pin 201 may have a surface coplanar with the surface of the top surface of the insulating body 202. When in the testing state (the first testing pin 201 may be pushed downward), the surface of the first testing terminal 21 may be coplanar with the top surface of the insulating body 202. The first curve surface 25 may have a center edge contacting the edge of the top surface of the insulating body 202 and a peripheral edge contacting the top surface of the second testing pin 203. In other words, the first curve surface 25 may extend obliquely upward from the edge of the top surface of the insulating body 202 to the top surface of the top surface of the second testing pin 203.

In one embodiment, the second testing terminal 23 may include a first curve surface 25 and a flat surface 26 on the top of the second testing pin 203. In another embodiment, the second testing terminal 23 may only include the first curve surface 25.

In one embodiment, the top surface of the second testing pin 203 may be a flat surface 26. In another embodiment, the top surface of the second testing pin 203 may be reduced to or overlapped with the curvature of the outer sidewall of the second testing pin 203. The first curve surface 25 may have a center edge contacting the edge of the top surface of the insulating body 202 and a peripheral edge contacting the outer sidewall surface of the second testing pin 203. In other words, the first curve surface 25 may extend obliquely upward from the edge of the top surface of the insulating body 202 to the top surface of the top surface of the second testing pin 203.

The testing probe 20 according to the present disclosure may have the surface of the first testing terminal 21 and the surface of the second testing terminal 23 approximating a spherical, an ellipsoidal, or a nearly spherical surface when the top surface of the first testing terminal 21 of the first testing pin 201 is pushed down to be coplanar with the top surface to the insulating body 202. Thus, the testing probe 20 according to the present disclosure may be used to test the test terminals in a spherical, ellipsoidal or nearly spherical shape. When the electrical characteristics testing is performed, the first testing terminal 21 of the first testing pin 201 may contact a first target surface of the spherical, ellipsoidal or nearly spherical test terminal and the second testing terminal 23 of the second testing pin 203 may contact a second target surface of the spherical, ellipsoidal or nearly spherical test terminal. The second target surface may be an area surrounding the first target surface. During the testing, the first testing pin 201 and the second testing pin 203 may have desirable surface contact with the spherical, ellipsoidal or nearly spherical test terminal. Thus, the test result of the electrical characteristics testing may precisely reflect the actual electrical characteristics of the spherical, ellipsoidal or nearly spherical test terminal to improve the test accuracy.

In another embodiment, in order to further improve the test accuracy, the curvature of the first curve surface 25 may be equal to or approximately equal to the curvature of the spherical, ellipsoidal, or nearly spherical test terminal.

In one embodiment, the second testing pin 203 may have a body shape with gradually reduced diameter toward the second testing terminal 23. The closer to the second testing terminal 23, the smaller the diameter. When a plurality of testing probes 20 is used in testing, the distance between the testing terminals of adjacent testing probes 20 may increase.

The present disclosure provides a first testing pin 201 and a second testing pin 203 integrated into one testing probe 20. The second testing pin 203 may surround the first testing pin 201. The second testing pin 203 and the first testing pin 201 may be electrically isolated by an insulating body 202. The testing probe 20 may have enhanced mechanical structural strength when the testing probe 20 dimension is relatively small.

Further, the first testing pin 201 and the second testing pin 203 may be coaxially configured. The distance between the first testing pin 201 and the second testing pin 203 may be precisely controlled without fluctuation during the testing to improve the measurement resolution. Further, the first testing pin 201 and the second testing pin 203 are integrated into one testing probe 20 according to the present disclosure. One testing probe 20 may be sufficient to perform the electrical characteristics testing as compared with two or more testing probes (e.g., double thimble or double gold finger) currently required for the same testing. Further, the first testing pin 201 may move upward and downward along the chamber 212. During the testing, the wear and tear of the first testing terminal 21 of the first testing pin 201 may be compensated by the movement of the first testing pin 201 driven by the elastic member 213 to ensure that the surface of the first testing terminal 21 of the first testing pin 201 is consistently coplanar with the surface of the second testing terminal 23 of the second testing pin 203. Thus, the wear and tear of the first testing pin 201 and the second testing pin 203 may not disrupt or compromise the electrical characteristics testing. Further, the first testing terminal 21 of the first testing pin 201 may protrude outward when not engaging with test terminals. When the testing is performed, the first testing pin 201 may contact the test terminal first so that the desirable alignment between the testing probe 20 and the test terminal may be verified. Further, the second testing terminal 23 may have a first curve surface 25. The first curve surface 25 may match the spherical surface of the spherically shaped test terminal. During the electrical characteristics testing, the second testing pin 203 of the testing probe 20 may have desirable surface contact with the spherical surface of the test terminal to improve the test accuracy.

The testing probe 20 according to the present disclosure may be used in electrical characteristics testing. In one embodiment, the testing probe 20 may be used in resistance measurement or large current measurement. The testing probe 20 may contact the testing terminals such that the first testing terminal 21 of the first testing pin 201 and the second testing terminal 23 of the second testing pin 203 contact the surface of the testing terminals. A test voltage may be applied between the first testing pin 201 and the second testing pin 203. The current between the first testing pin 201 and the second testing pin 203 through the test terminals may be measured. The test voltage may be divided by the measured current to obtain the measured resistance.

When the testing probe 20 according to the present disclosure is used in measuring the resistance, the test current may evenly flow from the first testing pin 201 in all directions toward the second testing pin 203. The annular area of the testing terminals (contacting the insulating body 202) between the first testing pin 201 and the second testing pin 203 may allow the averaging of the currents uniformly flowed in different directions to improve the measurement accuracy.

In other embodiments, the testing probe according to the present disclosure may be used in other electrical characteristics testing. For example, a plurality of testing probes may be used in an electrical characteristics testing to measure a current flowing between the first or the second testing pin of one testing probe and the first or the second testing pin of another testing probe, or a current flowing between the first and the second testing pin of one testing probe and the first and the second testing pin of another testing probe.

Figure 6:
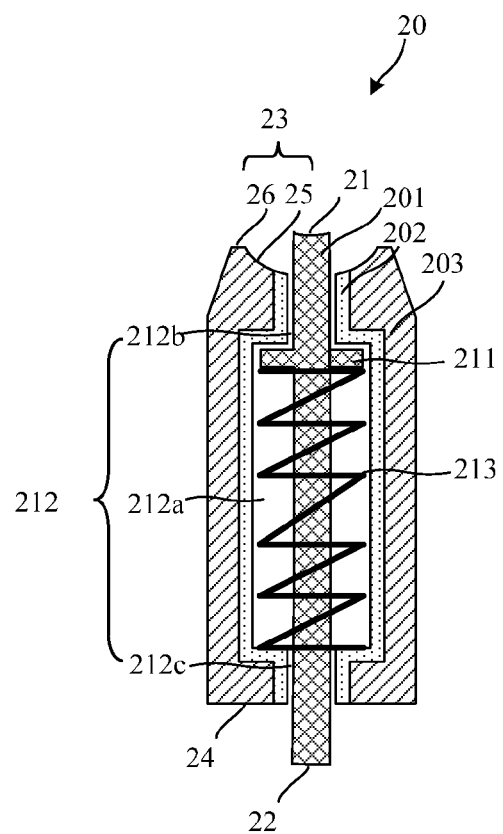
FIG. 6 illustrates a schematic view of another exemplary testing probe according to various disclosed embodiments of the present disclosure.

FIG. 6 illustrates a schematic view of another exemplary testing probe according to the present disclosure. Referring to FIG. 6, the present disclosure provides another testing probe 20. The testing probe 20 may be different from the previous embodiments. The first testing terminal 21 of the first testing pin 201 and the top of the insulating body 202 may have a concave second curve surface. The first curve surface 25 may have a center edge contacting the edge of the insulating body and a peripheral edge contacting the top surface of the second testing pin 203.

The first testing terminal 21 of the first testing pin 201 and the top of the insulating body 202 may have the concave second curve surface. The second testing terminal 23 of the second testing pin 203 may have the concave first curve surface 25. During the testing of the electrical characteristics, the surface of the first testing terminal 21 of the first testing pin 201 may have desirable surface contact with the spherical, ellipsoidal or nearly spherical test terminal. The contact area may be increased.

In one embodiment, the first curve surface 25 and the second curve surface may be equivalent to a portion of the curve surface of the spherical, ellipsoidal or nearly spherical test terminal. Thus, the testing probe 20 may have desirable surface contact with the spherical, ellipsoidal or nearly spherical test terminal to improve the test accuracy. The other aspects of the scope and description of the testing probe 20 may be consistent with the previous embodiments and will not be repeated herein.

Figure 3:
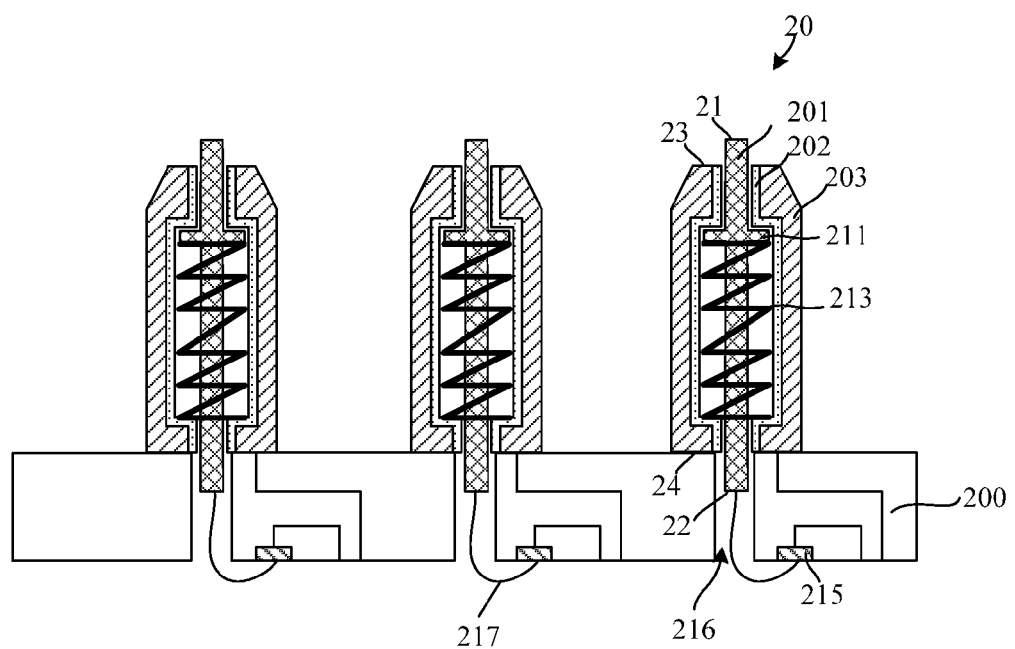
FIG. 3 illustrates a schematic view of an exemplary semiconductor testing fixture according to various disclosed embodiments of the present disclosure.

FIG. 3 illustrates a schematic view of an exemplary semiconductor testing fixture according to the present disclosure. Referring to FIG. 3, the present disclosure provides a semiconductor testing fixture. The semiconductor testing fixture may include a substrate 200 and a plurality of testing probes 20 disposed on the substrate 200.

The testing probe 20 may include an insulating body 202, a first testing pin 201, an elastic member 213, and a second testing pin 203. The insulating body 202 may include a chamber 212 which runs through the insulating body 202 between both ends. The first testing pin 201 may be disposed inside the chamber 212 of the first insulating body 202. The first testing pin 201 may include a first body, a first testing terminal 21 on one end of the first body, and a first connection terminal 22 on the other end of the first body. The elastic member 213 may be disposed inside the chamber 212. The elastic member 213 may be attached to the first testing pin 201 to drive the movement of the first testing pin 201 upward and downward along the chamber 212. The second testing pin 203 may be disposed around the outer sidewall of the insulating body 202 enclosing the first testing pin 201. The second testing pin 203 may be coaxial with the first testing pin 201. The second testing pin 203 may include a second body, a second testing terminal 23 on one end of the second body, and a second connection terminal 24 on the other end of the second body.

In one embodiment, the scope and the description of the testing probe 20 may be consistent with the previous embodiments.

Two or more testing probes 20 may be configured in the semiconductor testing fixture. In one embodiment, the testing probes 20 may be arranged in an array.

The second connecting pin 24 of the second testing pin 203 may be attached to the surface of the substrate 200. In one embodiment, the second connecting pin 24 of the second testing pin 203 may be soldered to the surface of the substrate 200. In certain other embodiments, the second testing pin 203 may be attached to the surface of the substrate 200 by using other mechanisms.

The substrate 200 may be configured with a plurality of through-holes 216. The through-holes 216 may provide the pathways for the movement of the first connection terminals 22 of the first testing pins 201 when the first testing pins 201 move upward or downward along the chamber 212.

The substrate 200 may be configured with a plurality of metal connection terminals 215 on the backside. The first connection terminal 22 of the first testing pin 201 may be connected to the metal connection terminal 215 through a metal wire. A portion of the metal wire 217 may be disposed inside the through-hole 216.

A signal transmission circuit may be formed inside the substrate 200. The signal transmission circuit may include a first input terminal, a first output terminal, a second input terminal, and a second output terminal. The first output terminal may be electrically connected to the metal connection terminal 215. The second output terminal may be electrically connected to the second connection terminal 24 of the second testing pin 203. The first input terminal and the second input terminal may be electrically connected to an external test circuit respectively. The external test circuit may provide test signals. The signal transmission circuit may be used to transmit the test signals produced by the external test circuit to the first testing pin 201 and the second testing pin 203 and to transmit the electrical signals generated during the testing process to the external test circuit.

The external test circuit may process the received electrical signals to obtain the parameter measurements.

The substrate 200 may be made of resin or other suitable PCB material. The first input terminal may be electrically connected to the first output terminal through a first metal wire inside the substrate 200. The second input terminal may be electrically connected to the second output terminal through a second metal wire inside the substrate 200.

In one embodiment, the substrate 200 may have a front side and a back side opposite to the front side. The back side of the substrate 200 may include an interface region. A plurality of second output terminals may be disposed on the front side of the substrate 200 to electrically connect to the second testing terminals 24 of the second testing pins 203. A plurality of first output terminals may be disposed on the back side of the substrate 200 to electrically connect to the metal connection terminals 215. A plurality of first and second input terminals may be disposed collectively in the interface region of the back side of the substrate 200. The plurality of first and second input terminals may be electrically connected to the external test circuit through one or more interfaces to simplify the interface circuit between the semiconductor testing fixture and the external test circuit.

In this embodiment, the substrate 200 may be formed by laminating multiple layers of PCB resin. Each PCB resin layer may include a plurality of interconnection structures. Each interconnection structure may include through-holes and a metal layer disposed on the surface of the PCB resin layer to connect the through-holes. When multiple layers of PCB resin are laminated together, the plurality of interconnection structures may form the first metal wires or the second metal wires. Thus, the plurality of the first input terminals and the second input terminals may be centralized in the interface region on the back side of the substrate 200.

In another embodiment, the substrate 200 may include a front side and a back side opposite to the front side. The back side of the substrate 200 may include an interface region. A plurality of second output terminals may be disposed on the front side of the substrate 200 to electrically connect to the second connection terminals 24 of the second testing pins 203. A plurality of second input terminals may be disposed on the back side of the substrate 200. Through-hole interconnection structures may be formed inside the substrate 200. The second input terminal may be electrically connected to the second output terminal through the through-hole interconnection structure inside the substrate 200. Accordingly, a plurality of first input terminals and first output terminals may be disposed on the back side of the substrate 200. The first output terminal may be electrically connected to the first output through a metal wire inside the substrate 200. The back side of the substrate 200 may be configured with a plurality of first re-wiring metal layers and second re-wiring metal layers. One end of the first re-wiring metal layer may be electrically connected to the first input terminal. The other end of the first re-wiring metal layer may be disposed in the interface region. One end of the second re-wiring metal layer may be electrically connected to the second input terminal. The other end of the second re-wiring metal layer may be disposed in the interface region. The first re-wiring metal layer and the second re-wiring metal layer in the interface region may be electrically connected to the external test circuit through one or more interfaces.

In another embodiment, test circuit (not shown) may be formed inside the substrate 200. The test circuit may include a first signal terminal and a second signal terminal. The first signal terminal may be electrically connected to the first connection terminal 22 of the first testing pin 201 through the metal connection terminal 215 and the metal wire 217. The second signal terminal may be electrically connected to the second connection terminal 24 of the second testing pin 203. When testing is performed by the test circuit, test signals (such as voltage signals or current signals) may be applied to the first testing pin 201 and the second testing pin 203. Electrical signals (such as current signals, etc.) generated during testing may be processed to obtain the parameter measurements (such as resistance, etc.)

In this embodiment, the substrate 200 may include a semiconductor substrate (such as silicon substrate, etc.) and a dielectric layer disposed on the semiconductor substrate. Semiconductor devices (such as transistors, etc.) may be formed on the semiconductor substrate. Metal interconnection wires and passive devices (such as resistors, capacitors, etc.) may be formed in the dielectric layer. The metal interconnection wires may connect the semiconductor devices and the passive devices to form a test circuit. The first signal terminal and the second signal terminal may be accessed through the first metal wire and the second metal wire in the dielectric layer that are electrically connected to the test circuit.

Figure 4:
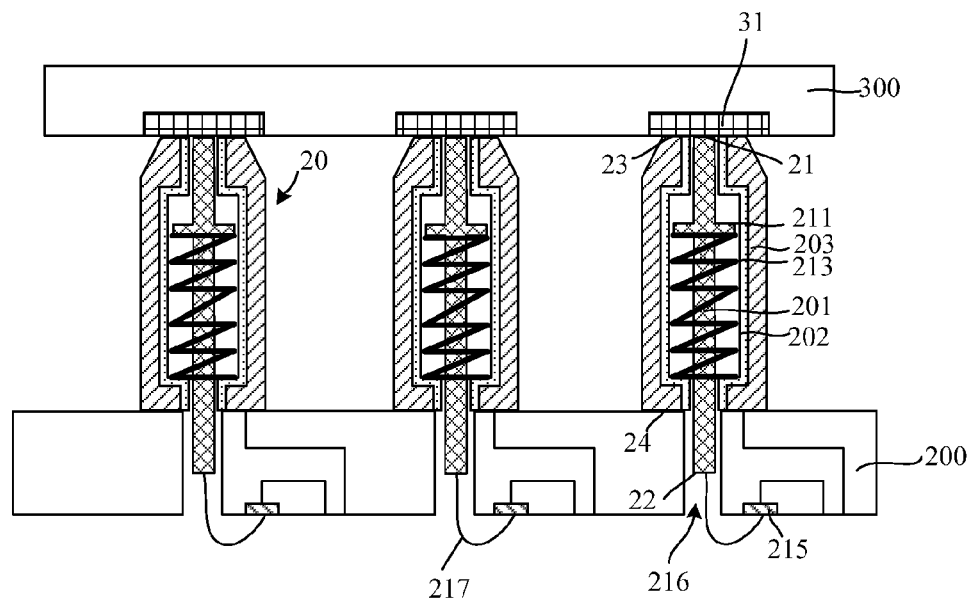
FIG. 4 illustrates a schematic view of another exemplary semiconductor testing fixture according to various disclosed embodiments of the present disclosure.

FIG. 4 illustrates a schematic view of another exemplary semiconductor testing fixture according to the present disclosure. Referring to FIG. 4, the present disclosure provides another semiconductor testing fixture. The semiconductor testing fixture may be placed on a test platform. Then a packaged structure 300 under testing may be loaded onto the test platform. A plurality of test terminals 31 may be configured on the packaged structure 300. The test terminals 31 may be pins. The packaged structure 300 under testing may be placed on the semiconductor testing fixture. The test terminals 31 of the packaged structure 300 under testing may first contact the surface of the first testing terminal 21 of the first testing pin 201. Then the packaged structure 300 under testing may be pressed downward. Accordingly the first testing pin 201 may be pressed downward until the surface of the first testing terminal 21 of the first testing pin 201 is coplanar with the surface of the second testing terminal 23 of the second testing pin 203. At this point, a portion of the surface of the test terminals 31 may be electrically connected to the testing terminals of the testing probes 20. The testing terminal may include the first testing terminal 21 of the first testing pin 201 and the second testing terminal 23 of the second testing pin 203. Then test signals may be applied between the first testing pin 201 and the second testing pin 203 to perform electrical characteristics testing.

In one embodiment, after the packaged structure 300 under testing is loaded, the packaged structure 300 may maintain a fixed position. The semiconductor testing fixture may be pushed upward by the mechanical arms of the test equipment. The testing probes 20 on the semiconductor testing fixture may contact the test terminals 31 of the packaged structure 300 under testing to perform electrical characteristics testing.

When the packaged structure 300 under testing is loaded, in order to precisely align the test terminals 31 of the packaged structure 300 under testing with the testing probes 20 on the semiconductor testing fixture, the protruded first testing terminals 21 of the first testing pins 201 may be used as alignment markers to guide the loading of the packaged structure 300 under testing. The position relationship between the packaged structure 300 under testing and the semiconductor testing fixture may be established by inspecting the alignment markers. The test terminals may have fixed positions on the packaged structure 300 under testing.

Accordingly, the testing probes 20 may also have fixed positions on the semiconductor testing fixture. Consequently, the position relationship between the test terminals 31 and the corresponding testing probes 20 may be established. Thus, the test terminals 31 may be precisely aligned to contact the corresponding testing probes 20. An alignment marker inspection unit may be configured to inspect the alignment markers. The alignment marker inspection unit may include a lighting element and a sensing element. The lighting element may be configured to provide inspection lighting for individual testing probe 20. The sensing element may be configured to sense the light reflected or diffracted by the testing probe 20 to produce the corresponding electrical signal. The alignment marker inspection unit may be mounted on the mechanical arms.

In another embodiment, the reasons that the protruded first testing pin 201 may be used as the alignment marker may include the following. Before the testing starts, the first testing terminal 21 of the first testing pin 201 may protrude outward. In other words, the surface of the first testing terminal 21 of the first testing pin 201 may protrude above the surface of the second testing terminal 23 of the second testing pin 203. When inspecting the alignment marker, the inspection lighting may shine on the testing probe 20. The light reflected or diffracted by the first testing terminal 21 of the first testing pin 201 and the second testing terminal 23 of the second testing pin 203 may be sensed to produce the corresponding electrical signal. Because the surface of the first testing terminal 21 of the first testing pin 201 and the surface of the second testing terminal 23 of the second testing pin 203 may be at different heights, the intensity of the reflected or diffracted light may be different. The corresponding electrical signal may capture the light intensity change in the high and low signal level. The alignment marker inspection may be achieved through the recognition of the high and low electrical signal change.

In the process of the electrical characteristics testing, the upward and downward movement of the first testing pin 201 may be driven by the external force. When the packaged structure 300 under testing is loaded, it is difficult to verify whether the packaged structure 300 under testing is loaded properly and whether the testing probes 20 have desirable contact with the test terminals 31. When the actual position of the packaged structure 300 under testing exceeds the target position, overloading may occur. Overloading may cause the testing probes 20 to break or bend. When the actual position of the packaged structure 300 under testing does not reach the target position, underloading may occur. Underloading may cause poor contact and other undesirable effects.

In another embodiment, the substrate 200 may further include an inspection unit (not shown) configured to inspect the position of the first connection terminal 22 of the first testing pin 201. In the process of the electrical characteristics testing, the inspection unit may inspect the movement position of the first connection terminal 22 of the first testing pin 201 to verify whether the surface of the first testing terminal 21 of the first testing pin 201 is coplanar with the surface of the second connection terminal 23 of the second testing pin 203. The target position may refer to the position where the packaged structure 300 under testing is located when the surface of the test terminals 31 of the packaged structure 300 under testing maintains desirable contact with the first testing terminal 21 of the first testing pin 201 and the second testing terminal 23 of the second testing pin 203.

In another embodiment, the inspection unit may be a photo detector unit. The photo detector unit may include a light emitting element and a light receiving element. The light emitting element may be configured to emit the light for inspection. The light receiving element may be configured to detect the inspection light to produce a corresponding electrical signal. The light emitting element and the light receiving element may be disposed on two sides of the sidewall surface of the through-hole 216. The distance between the light emitting element or the light receiving element and the top surface of the substrate 200 is defined as a third distance. When not in the testing state, the distance of the surface of the first testing terminal 21 of the first testing pin 201 protruding above the surface of the second testing terminal 23 of the second testing pin 203 is defined as a second distance. The third distance may be equal to or slightly less than the second distance. During the testing, when the first connection terminal 22 of the first testing pin 201 is pushed downward and reaches the optical path between the light emitting element and the light receiving element, the inspection light may be blocked. The electrical signal produced by the light receiving element may exhibit a sudden change of the signal level, which indicates that the packaged structure 300 under testing reaches the target position. At this point, the surface of the first testing terminal 21 of the first testing pin 201 may be coplanar with the surface of the second testing terminal 23 of the second testing pin 203, and the surface of the first testing terminal 21 of the first testing pin 201 and the surface of the second testing terminal 23 of the second testing pin 203 may have desirable contact with the surface of the test terminals 31.

In another embodiment, the inspection unit may be a magnetic sensing unit. The magnetic sensing unit may include a magnetic excitation element and a magnetic sensing element. The magnetic excitation element may provide the magnetic field. The magnetic sensing element may sense the magnetic field to produce a corresponding electrical signal. The magnetic excitation element may disposed on the connection terminal 22 of the first testing pin 201. For example, the first connection terminal 22 of the first testing pin 201 may be made of magnetic material (such as barium iron oxide). The magnetic sensing element may be disposed on the sidewall of the through-hole 216. The distance between the magnetic sensing element and the top surface of the substrate 200 is defined as a third distance. When not in the testing state, the distance of the surface of the first testing terminal 21 of the first testing pin 201 protruding above the surface of the second testing terminal 23 of the second testing pin 203 is defined as a second distance. The third distance may be equal to or slightly less than the second distance. During the testing, when the first connection terminal 22 of the first testing pin 201 is pushed downward and reaches the magnetic sensing element position, the magnetic sensing element may sense the magnetic field to produce the corresponding electrical signal. The electrical signal may exhibit a sudden change of the signal level, which indicates that the packaged structure 300 under testing reaches the target position. At this point, the surface of the first testing terminal 21 of the first testing pin 201 may be coplanar with the surface of the second testing terminal 23 of the second testing pin 203, and the surface of the first testing terminal 21 of the first testing pin 201 and the surface of the second testing terminal 23 of the second testing pin 203 may have desirable contact with the surface of the test terminals 31.

In another embodiment, the inspection unit may be an infrared distance measuring unit, an ultrasonic distance measuring unit, or a laser distance measuring unit. The infrared distance measuring unit, the ultrasonic distance measuring unit, or the laser distance measuring unit may directly measure the distance of the movement of the first connection terminal 22 of the first testing pin 201 to determine whether the packaged structure 300 under testing reaches the target position.

The semiconductor testing fixture according to the present disclosure may perform the electrical characteristics testing simultaneously on the plurality of the test terminals of the packaged structure 300 under testing to improve the efficiency and the accuracy of the testing.

The semiconductor testing fixture according to the present disclosure may be used in the automatic testing (loading the packaged structure by a mechanical arm) or in the manual testing (loading the packaged structure by human).

Figure 7:
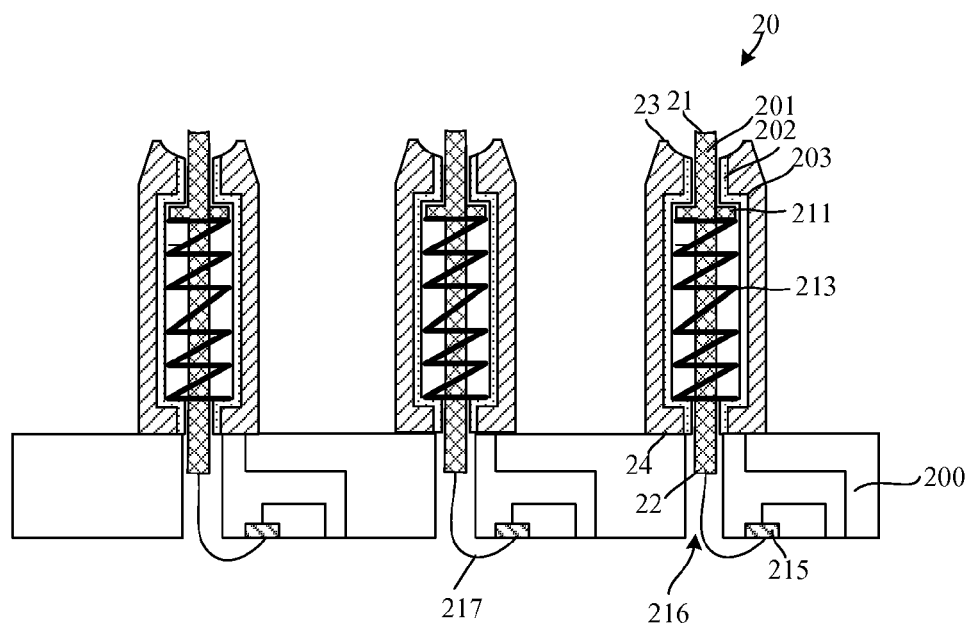
FIG. 7 illustrates a schematic view of another exemplary semiconductor testing fixture according to various disclosed embodiments of the present disclosure.

FIG. 7 illustrates a schematic view of another exemplary semiconductor testing fixture according to the present disclosure. Referring to FIG. 7, the present disclosure provides a semiconductor testing fixture. The semiconductor testing fixture may be similar to the semiconductor testing fixture shown in FIG. 3. The semiconductor testing fixture shown in FIG. 3 may have a flat surface on the top of the first testing pin 201 and the second testing pin 203 while the semiconductor testing fixture shown in FIG. 7 may have a concave second curve surface on the top of the first testing pin 201 and the insulating body 202 and a concave first curve surface 25 on the top of the second testing pin 203. Other aspects of the semiconductor testing fixture may be consistent with the previous embodiments.

Figure 8:
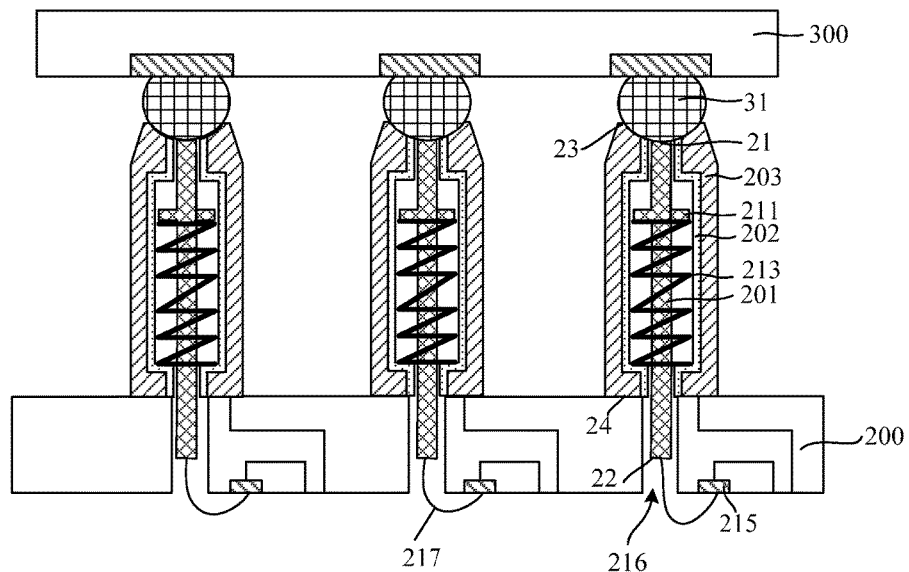
FIG. 8 illustrates a schematic view of another exemplary semiconductor testing fixture according to various disclosed embodiments of the present disclosure.

FIG. 8 illustrates a schematic view of another exemplary semiconductor testing fixture according to the present disclosure. Referring to FIG. 8, the present disclosure provides a semiconductor testing fixture. The semiconductor testing fixture may be similar to the semiconductor testing fixture shown in FIG. 4. The semiconductor testing fixture shown in FIG. 4 may have a flat surface on the top of the first testing pin 201 and the second testing pin 203 while the semiconductor testing fixture shown in FIG. 8 may have a concave second curve surface on the top of the first testing pin 201 and the insulating body 202 and a concave first curve surface 25 on the top of the second testing pin 203. Other aspects of the semiconductor testing fixture may be consistent with the previous embodiments.

Figure 9:
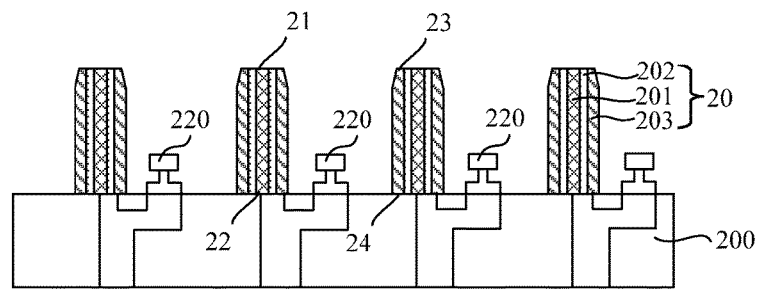
FIG. 9 illustrates a schematic view of another exemplary semiconductor testing fixture according to various disclosed embodiments of the present disclosure.

FIG. 9 illustrates a schematic view of another exemplary semiconductor testing fixture according to the present disclosure. Referring to FIG. 9, the present disclosure provides a semiconductor testing fixture. The semiconductor testing fixture may include a substrate 200, a plurality of testing probes 20 according to the present disclosure, and a plurality of inspection units 220 electrically connected with either the first connection terminals 22 of the first testing pins 201 or the second connection terminals 24 of the second testing pins 203. The inspection unit 220 may be configured to detect whether the testing probe 20 has desirable contact with the test terminal during the testing of the electrical characteristics. Other aspects of the semiconductor testing fixture may be consistent with the scope and description in the previous embodiments.

The inspection unit 220 may include a first electrode and a second electrode. The inspection unit 220 may be a LED with the first and second electrodes or a visual indicator. During the testing, the light emitted from the inspection unit may be used to verify whether the testing probe 20 has desirable contact with the test terminal.

The inspection unit 220 may have the first electrode electrically connected to either the first connection terminal 22 of the first testing pin 201 or the second connection terminal 24 of the second testing pin 203. The inspection unit 220 may the second electrode electrically connected to an external test circuit.

In one embodiment, the inspection unit 220 may have the first electrode electrically connected to the second the connection terminal 24 of the second testing pin 203. The first electrode of the inspection unit 220 may be electrically connected to the second connection terminal 24 of the second testing pin 203 through a metal interconnection wire in the substrate 200. A signal transmission circuit may be formed in the substrate 200. The signal transmission circuit may include a first input terminal, a first output terminal, a second input terminal, a second output terminal. The first output terminal may be electrically connected to the first connection terminal 22 of the first testing pin 201. The second output terminal may be electrically connected to the second electrode of the inspection unit 220. The first input terminal and the second input terminal may be electrically connected to the external test circuit respectively.

The external test circuit may provide test signals. The signal transmission circuit may be used to transmit the test signals produced by the external test circuit to the first testing pin 201 and the second testing pin 203 and to transmit the electrical signals generated during the testing process to the external test circuit. The external test circuit may process the received electrical signals to obtain the parameter measurements.

The substrate 200 may be made of resin or other suitable PCB material. The first input terminal may be electrically connected to the first output terminal through a first metal wire inside the substrate 200. The second input terminal may be electrically connected to the second output terminal through a second metal wire inside the substrate 200.

In one embodiment, the substrate 200 may have a front side and a back side opposite to the front side. The back side of the substrate 200 may include an interface region. A plurality of second output terminals may be disposed on the front side of the substrate 200. The first output terminal may be electrically connected to the first connection terminal 22 of the first testing pin 201. The second output terminal may electrically connected to the second electrode of the inspection unit 220. A plurality of first and second output terminals may be disposed collectively in the interface region on the back side of the substrate 200. The plurality of the first and second output terminals may be connected to the external test circuit through one or more interfaces such that the interface circuit between the semiconductor testing fixture and the external test circuit may be simplified.

In one embodiment, the substrate 200 may be formed by laminating multiple layers of PCB resin. Each PCB resin layer may include a plurality of interconnection structures. Each interconnection structure may include through-holes and a metal layer disposed on the surface of the PCB resin layer to connect the through-holes. When multiple layers of PCB resin are laminated together, the plurality of interconnection structures may form the first metal wires or the second metal wires. Thus, the plurality of the first input terminals and the second input terminals may be centralized in the interface region on the back side of the substrate 200.

In another embodiment, the substrate 200 may include a front side and a back side opposite to the front side. The back side of the substrate 200 may include an interface region. A plurality of second output terminals may be disposed on the front side of the substrate 200 to electrically connect to the second connection terminals 24 of the second testing pins 203. A plurality of second input terminals may be disposed on the back side of the substrate 200. Through-hole interconnection structures may be formed inside the substrate 200. The second input terminal may be electrically connected to the second output terminal through the through-hole interconnection structure inside the substrate 200. Accordingly, a plurality of first input terminals and first output terminals may be disposed on the back side of the substrate 200. The first output terminal may be electrically connected to the first output through a metal wire inside the substrate 200. The back side of the substrate 200 may be configured with a plurality of first re-wiring metal layers and second re-wiring metal layers. One end of the first re-wiring metal layer may be electrically connected to the first input terminal. The other end of the first re-wiring metal layer may be disposed in the interface region. One end of the second re-wiring metal layer may be electrically connected to the second input terminal. The other end of the second re-wiring metal layer may be disposed in the interface region. The first re-wiring metal layer and the second re-wiring metal layer in the interface region may be electrically connected to the external test circuit through one or more interfaces.

Figure 10:
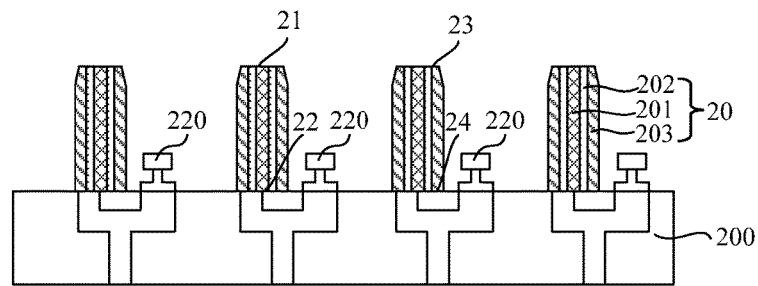
FIG. 10 illustrates a schematic view of another exemplary semiconductor testing fixture according to various disclosed embodiments of the present disclosure.

FIG. 10 illustrates a schematic view of another exemplary semiconductor testing fixture according to the present disclosure. Referring to FIG. 10, the present disclosure provides a semiconductor testing fixture. The semiconductor testing fixture may include a substrate 200, a plurality of testing probes 20 according to the present disclosure, and a plurality of inspection units 220 electrically connected to the first connection terminals 22 of the first testing pins 201. In one embodiment, the inspection unit 220 may have a first electrode connected to the first connection terminal 22 of the first testing pin 201 through a metal wire in the substrate 200. A signal transmission circuit may be formed in the substrate 200. The signal transmission circuit may include a first input terminal, a first output terminal, a second input terminal, and a second output terminal. The first output terminal may be electrically connected to the second electrode of the inspection unit 220. The second output terminal may be electrically connected to the second connection terminal 24 of the second testing pin 203. The first input terminal and the second input terminal may be electrically connected to the external test circuit respectively.

The scope and description of the signal transmission circuit may be consistent with the previous embodiments and will not be repeated herein.

In certain embodiments, the first output terminal of the signal transmission circuit may be electrically connected to the first connection terminal 22 of the first testing pin 201. The second output terminal of the signal transmission circuit may be electrically connected to the second connection terminal 24 of the second testing pin 203. The inspection unit 220 may be connected in series between the first output terminal of the signal transmission circuit and the external test circuit. Alternatively, the inspection unit 220 may be connected in series between the second output terminal of the signal transmission circuit and the external test circuit.

Further, when the semiconductor testing fixture is used to test the electrical characteristics, each inspection unit 220 may be connected in series in the test circuit loop including the first testing pin 201 and the second testing pin 203. The inspection unit 220 may be used to determine whether each testing probe 20 has desirable contact with the corresponding test terminal. For example, when the visual indicator of the inspection unit 220 turns on steadily, the testing probe 20 may have desirable contact with the corresponding test terminal. When the visual indicator of the inspection unit 220 turns on intermittently, the testing probe 20 may have less than desirable contact with the corresponding test terminal. When the visual indicator of the inspection unit 220 does not turn on, at least one of the first testing pin 201 and the second testing pin 203 of the testing probe 20 may not have any contact with the corresponding test terminal, or the signal transmission circuit or the external test circuit may be faulty.

Figure 11:
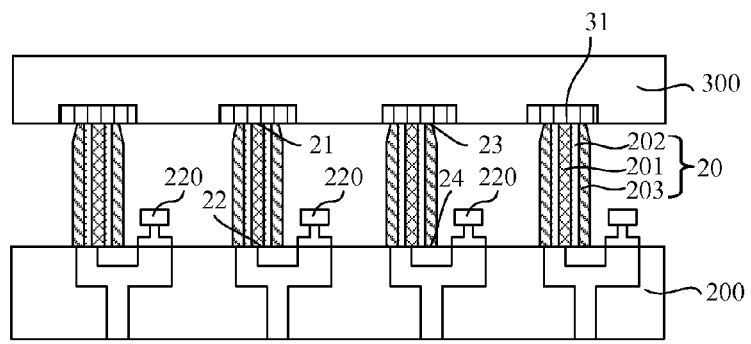
FIG. 11 illustrates a schematic view of another exemplary semiconductor testing fixture according to various disclosed embodiments of the present disclosure.

FIG. 11 illustrates a schematic view of another exemplary semiconductor testing fixture according to the present disclosure. Referring to FIG. 11, the present disclosure provides a semiconductor testing fixture. The semiconductor testing fixture may include a substrate 200, a plurality of testing probes 20, and a plurality of inspection units 220.

The testing probe 20 may be any one of the testing probes 20 described in the previous embodiments. The inspection unit 220 may be electrically connected to either the first connection terminal 22 of the first testing pin 201 or the second connection terminal 24 of the second testing pin 203. The inspection unit 220 may be configured to determine whether the testing probe 20 has desirable contact with the corresponding test terminal during the testing of the electrical characteristics.

The semiconductor testing fixture may be placed on a test platform. Then the packaged structure 300 under testing may be placed on the semiconductor testing fixture. The packaged structure 300 under testing may be configured with a plurality of test terminals 31. The test terminals may be pins or solder pads. A portion of the test terminal may be electrically connected to the corresponding testing terminals of the testing probe 20, which may be the first testing terminal 21 of the first testing pin 201 and the second testing terminal 22 of the second testing pin 203. Then a test signal may be applied between the first testing pin 201 and the second testing pin 203 to perform the electrical characteristics testing.

During the testing of the electrical characteristics, the inspection unit 220 may be used to determine whether each testing probe 20 has desirable contact with the corresponding test terminal.

The semiconductor testing fixture according to the present disclosure may perform the electrical characteristics testing simultaneously on the plurality of the test terminals of the packaged structure 300 under testing to improve the efficiency and the accuracy of the testing.

The semiconductor testing fixture according to the present disclosure may be used in the automatic testing (loading the packaged structure by a mechanical arm) or in the manual testing (loading the packaged structure by human).

Figure 12:
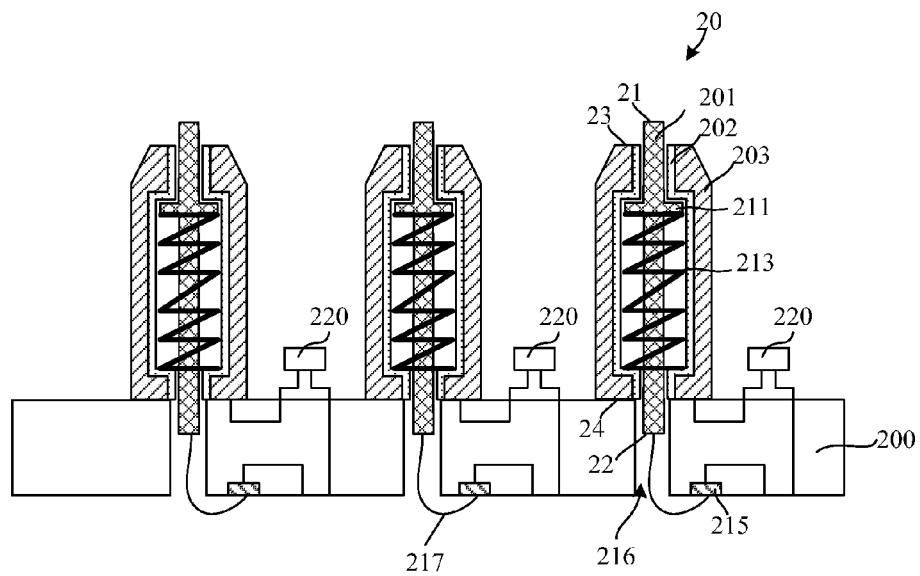
FIG. 12 illustrates a schematic view of another exemplary semiconductor testing fixture according to various disclosed embodiments of the present disclosure.

FIG. 12 illustrates a schematic view of another exemplary semiconductor testing fixture according to the present disclosure. Referring to FIG. 12, the present disclosure provides a semiconductor testing fixture. The semiconductor testing fixture may include a substrate 200, a plurality of testing probes 20, and a plurality of inspection units 220.

The testing probe 20 may be any one of the testing probes 20 described in the previous embodiments. The inspection unit 220 may be electrically connected to either the first connection terminal 22 of the first testing pin 201 or the second connection terminal 24 of the second testing pin 203. The inspection unit 220 may be configured to determine whether the testing probe 20 has desirable contact with the corresponding test terminal during the testing of the electrical characteristics.

In one embodiment, the inspection unit 220 may have a first electrode electrically connected to the second connection terminal 24 of the second testing pin 203. The first electrode of the inspection unit 220 may be electrically connected to the second connection terminal 24 of the second testing pin 203 through a metal interconnection wire in the substrate 200. A signal transmission circuit may be formed in the substrate 200. The signal transmission circuit may include a first input terminal, a first output terminal, a second input terminal, and a second output terminal. The first output terminal may be electrically connected to the first connection terminal 21 of the first testing pin 201. The second output terminal may be electrically connected to the second electrode of the of the inspection unit 220. The first input terminal and the second input terminal may be electrically connected to an external test circuit respectively.

In another embodiment, the first electrode of the inspection unit 220 may be electrically connected to the first connection terminal 21 of the first testing pin 201. In another embodiment, the first electrode of the inspection unit 220 may be electrically connected to the metal wire 217 and the second electrode of the inspection unit 220 may be electrically connected to the metal connection terminal 215. The signal transmission circuit may be formed in the substrate 200. The signal transmission circuit may include the first input terminal, the first output terminal, the second input terminal, and the second output terminal. The first output terminal may be electrically connected to the metal connection terminal 215. The second output terminal may be electrically connected to the second connection terminal 24 of the second testing pin 203. The first input terminal and the second input terminal may be electrically connected to the external test circuit respectively.

The scope and description of the signal transmission circuit may be consistent with the previous embodiments and will not be repeated herein.

Figure 13:
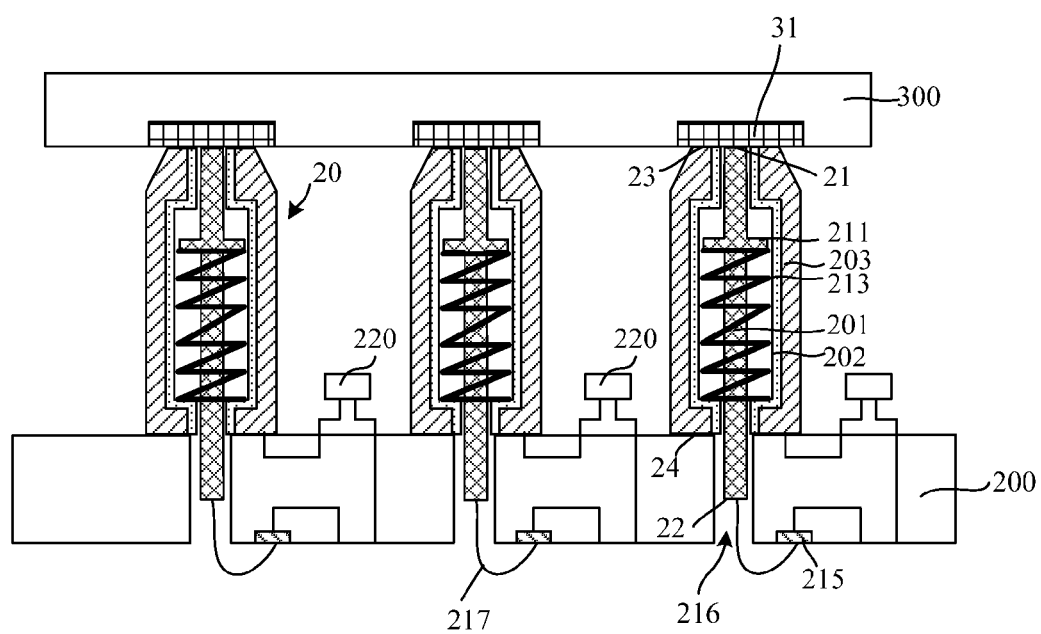
FIG. 13 illustrates a schematic view of another exemplary semiconductor testing fixture according to various disclosed embodiments of the present disclosure.

FIG. 13 illustrates a schematic view of another exemplary semiconductor testing fixture according to the present disclosure. Referring to FIG. 13, the present disclosure provides a semiconductor testing fixture. The semiconductor testing fixture may include a substrate 200, a plurality of testing probes 20, and a plurality of inspection units 220.

The testing probe 20 may be any one of the testing probes 20 described in the previous embodiments. The inspection unit 220 may be electrically connected to either the first connection terminal 22 of the first testing pin 201 or the second connection terminal 24 of the second testing pin 203. The inspection unit 220 may be configured to determine whether the testing probe 20 has desirable contact with the corresponding test terminal during the testing of the electrical characteristics.

The semiconductor testing fixture may be placed on a test platform. Then a packaged structure 300 under testing may be loaded onto the test platform. A plurality of test terminals 31 may be configured on the packaged structure 300. The test terminals 31 may be pins. The packaged structure 300 under testing may be placed on the semiconductor testing fixture. The test terminals 31 of the packaged structure 300 under testing may first contact the surface of the first testing terminal 21 of the first testing pin 201. Then the packaged structure 300 under testing may be pressed downward. Accordingly the first testing pin 201 may be pressed downward until the surface of the first testing terminal 21 of the first testing pin 201 is coplanar with the surface of the second testing terminal 23 of the second testing pin 203. At this point, a portion of the surface of the test terminals 31 may be electrically connected to the testing terminals of the testing probes 20. The testing terminal may include the first testing terminal 21 of the first testing pin 201 and the second testing terminal 23 of the second testing pin 203. Then test signals may be applied between the first testing pin 201 and the second testing pin 203 to perform electrical characteristics testing.

In one embodiment, after the packaged structure 300 under testing is loaded, the packaged structure 300 may maintain a fixed position. The semiconductor testing fixture may be pushed upward by the mechanical arms of the test equipment. The testing probes 20 on the semiconductor testing fixture may contact the test terminals 31 of the packaged structure 300 under testing to perform electrical characteristics testing.

The inspection unit 220 may include a first electrode and a second electrode. The inspection unit 220 may be a LED with the first and second electrodes or a visual indicator. During the testing, the first testing terminal 21 of the first testing pin 201 and the second testing terminal 23 of the second testing pin 203 may contact with the surface of the test terminal 31. The inspection unit 220, the first testing pin 201, the second testing pin 203, and the test terminal 31 may form a looped circuit. The light emitted from the inspection unit may be used to verify whether the testing probe 20 has desirable contact with the test terminal.

In the process of the electrical characteristics testing, the upward and downward movement of the first testing pin 201 may be driven by the external force. When the packaged structure 300 under testing is loaded, it is difficult to verify whether the packaged structure 300 under testing is loaded properly and whether the testing probes 20 have desirable contact with the test terminals 31. When the actual position of the packaged structure 300 under testing exceeds the target position, overloading may occur. Overloading may cause the testing probes 20 to break or bend. When the actual position of the packaged structure 300 under testing does not reach the target position, underloading may occur. Underloading may cause poor contact and other undesirable effects.

In certain embodiments, the inspection 220 may be used to determine whether the packaged structure 300 under testing reaches the target position. The inspection unit 220 may include a light emitting element and a light sensing element. The light emitting element may emit light when a current flows through the light emitting element. The light emitting element may include a first electrode and a second electrode. Specifically, the light emitting element may be a LED with the first and second electrodes (for example, a red color LED). The first electrode of the light emitting element may be electrically connected to either the first connection terminal 23 of the first testing pin 201 or the second connection terminal 24 of the second testing pin 203. The second electrode of the light emitting element may be electrically connected the external test circuit. The specific connection circuit may be referred to the connection of the first and second electrodes of the inspection unit 220 to the testing probe 20 and the signal transmission circuit in the previous embodiments.

The light sensing element may be disposed facing toward the light emitting element to sense the light emitted from the light emitting element to produce the corresponding electrical signal. Based on the electrical signal level transition, the inspection unit 220 may determine whether the packaged structure 300 under testing reaches the target position. Specifically, before the packaged structure 300 under testing is loaded, the testing probes may not contact the test terminals 31 of the packaged structure 300 under testing. The light sensing element may produce the electrical signal at the low level or zero level. Then the packaged structure 300 under testing is loaded. The test terminals 31 of the packaged structure 300 under testing may first contact the first testing terminal 31 of the first testing pin 201. Then the packaged structure 300 under testing may be pushed downward under certain pressure. Accordingly, the first testing pin 201 may be pushed downward until the surface of the first testing terminal 21 of the first testing pin 201 is coplanar with the surface of the second testing terminal 23 of the second testing pin 203. The surface of the first testing terminal 21 of the first testing pin 201 and the surface of the second testing terminal 23 of the second testing pin 203 may contact the surface of the test terminal. At this point, the inspection unit 220, the first testing pin 201, the second testing pin 203, and the test terminal 31 may form a looped circuit with current flow. The light emitting element may emit light. At the same time, the light sensing element may sense the light emitted from the light emitting element to produce the corresponding electrical signal. The electrical signal level may transition from low level to high level. The sudden change of the electrical signal level may be used to determine that the packaged structure 300 under testing reaches the target position and to stop the movement or loading of the packaged structure 300 under testing.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A testing probe for a semiconductor testing fixture, comprising:
   an insulating body having a chamber configured through the insulating body;
   a first testing pin disposed inside the chamber of the insulating body, and including: a first testing terminal on one end of the first testing pin and a first connection terminal on another end of the first testing pin;
   an elastic member disposed inside the chamber and attached to the first testing pin to drive an upward or downward movement of the first testing pin along the chamber; and
   a second testing pin disposed around an outer sidewall surface of the insulating body enclosing the first testing pin, and including: a second testing terminal on one end of the second testing pin and a second connection terminal on another end of the second testing pin, wherein:
   the first testing terminal has a flat surface;
   the top surface of the insulating body is lower than the flat surface of the first testing terminal; and
   the second testing terminal has a concave first curve surface including: a center edge contacting an edge of the insulating body and a peripheral edge contacting a top surface of the second testing pin.

2. The testing probe of claim 1, wherein the chamber in the insulating body includes:
   a first chamber section;
   a second chamber section connecting to an upper end of the first chamber section; and
   a third chamber section connecting to a lower end of the first chamber section, wherein:
      the second and third chamber sections have a diameter smaller than a diameter of the first chamber section;
      the first testing pin penetrates through the first, second, and third chamber sections; and
      the elastic member is disposed at least in the first chamber section.

3. The testing probe of claim 2, wherein:
   the first testing pin has a stopper protrusion protruded from a first body of the first testing pin to restrain the first testing pin inside the first chamber section, wherein the first testing terminal and the first connection terminal are configured on ends of the first body; and
   the elastic member has one end pressing against the stopper protrusion and another end pressing against a bottom wall of the first chamber section.

4. The testing probe of claim 3, wherein:
   the elastic member includes a spring;
   the first testing pin passes through a hollow structure in a middle of the spring; and
   the spring has one end pressing against the stopper protrusion and another end pressing against the bottom wall of the first chamber section.

5. The testing probe of claim 3, wherein:
   the elastic member includes one or more metal spring plates; and
   the metal spring plate has one end pressing against the stopper protrusion and another end pressing against the bottom wall of the first chamber section.

6. The testing probe of claim 1, wherein:
   the first testing terminal has a concave second curve surface; and
   the top surface of the insulating body has a concave curve surface connecting the first curve surface and the second curve surface when the testing probe engages with a spherical, ellipsoidal or nearly spherical test terminal.

7. The testing probe of claim 6, wherein:
   the first curve surface and the second curve surface approximate a curvature of the spherical, ellipsoidal or nearly spherical test terminal.

8. A semiconductor testing fixture, comprising:
   a plurality of testing probes according to the testing probe of claim 1 and a substrate,
   wherein the plurality of testing probes is configured on the substrate.

9. A semiconductor testing fixture, comprising:
   a substrate;
   a plurality of the testing probes configured on the substrate,
   wherein each testing probe includes:
      an insulating body having a chamber configured through the insulating body;
      a first testing pin disposed inside the chamber of the insulating body, and including: a first testing terminal on one end of the first testing pin and a first connection terminal on another end of the first testing pin;
      an elastic member disposed inside the chamber and attached to the first testing pin to drive an upward or downward movement of the first testing pin along the chamber; and
      a second testing pin disposed around an outer sidewall surface of the insulating body enclosing the first testing pin, and including: a second testing terminal on one end of the second testing pin and a second connection terminal on another end of the second testing pin, wherein:
         the first testing terminal has a flat surface;
         the top surface of the insulating body is lower than the flat surface of the first testing terminal; and
         the second testing terminal has a concave first curve surface including: a center edge contacting an edge of the insulating body and a peripheral edge contacting a top surface of the second testing pin; and an inspection unit electrically connected to either the first connection terminal of the first testing pin or the second connection terminal of the second testing pin and configured to determine whether the testing probe has a contact with the first connection terminal or the second connection terminal during an electrical characteristics testing.

10. The semiconductor testing fixture of claim 9, wherein:
the inspection unit includes a first electrode and a second electrode; and
the inspection unit is a light emitting diode (LED) or a visual indicator.

11. The semiconductor testing fixture of claim 10, wherein:
the first electrode of the inspection unit is electrically connected to either the first connection terminal of the first testing pin or the second connection terminal of the second testing pin; and
the second electrode of the inspection unit is electrically connected to an external test circuit.

12. The semiconductor testing fixture of claim 11, wherein:
a signal transmission circuit formed in the substrate includes a first input terminal, a first output terminal, a second input terminal, and a second output terminal;
when the first electrode of the inspection unit is electrically connected to the first connection terminal of the first testing pin, the first output terminal is electrically connected to the second electrode of the inspection unit, the second output terminal is electrically connected to the second connection terminal of the second testing pin, and the first input terminal and the second input terminal are electrically connected to the external test circuit respectively; and
when the first electrode of the inspection unit is electrically connected to the second connection terminal of the second testing pin, the first output terminal is electrically connected to the first connection terminal of the first testing pin, the second output terminal is electrically connected to the second electrode of the inspection unit, and the first input terminal and the second input terminal are electrically connected to the external test circuit respectively.

13. A method for forming a testing probe for a semiconductor testing fixture, comprising:
providing an insulating body having a chamber through the insulating body;
configuring a first testing pin inside the chamber of the insulating body, the first testing pin including: a first testing terminal on one end of the first testing pin and a first connection terminal on another end of the first testing pin;

configuring an elastic member inside the chamber and attached to the first testing pin to drive an upward or downward movement of the first testing pin along the chamber; and configuring a second testing pin around an outer sidewall surface of the insulating body enclosing the first testing pin, the second testing pin including: a second testing terminal on one end of the second testing pin and a second connection terminal on another end of the second testing pin, wherein:
the first testing terminal has a flat surface;
the top surface of the insulating body is lower than the flat surface of the first testing terminal; and
the second testing terminal has a concave first curve surface including: a center edge contacting an edge of the insulating body and a peripheral edge contacting a top surface of the second testing pin.

14. The method of claim 13, wherein the chamber in the insulating body includes:
a first chamber section;
a second chamber section connecting to an upper end of the first chamber section; and
a third chamber section connecting to a lower end of the first chamber section, wherein:
the second and third chamber sections have a diameter smaller than a diameter of the first chamber section;
the first testing pin penetrates through the first, second, and third chamber sections; and
the elastic member is disposed at least in the first chamber section.

15. The method of claim 14, wherein:
the first testing pin has a stopper protrusion protruded from a first body of the first testing pin to restrain the first testing pin inside the first chamber section, wherein the first testing terminal and the first connection terminal are configured on ends of the first body; and
the elastic member has one end pressing against the stopper protrusion and another end pressing against a bottom wall of the first chamber section.

16. The method of claim 13, wherein:
the first testing terminal has a concave second curve surface; and
the top surface of the insulating body has a concave curve surface connecting the first curve surface and the second curve surface when the testing probe engages with a spherical, ellipsoidal or nearly spherical test terminal.

17. The method of claim 16, wherein:
the first curve surface and the second curve surface approximate a curvature of the spherical, ellipsoidal or nearly spherical test terminal.

18. The method of claim 13, further including:
configuring a plurality of testing probes on a substrate.

* * * * *